(12) United States Patent
Ellenbogen et al.

(10) Patent No.: US 11,954,994 B2
(45) Date of Patent: Apr. 9, 2024

(54) PERSONNEL INSPECTION WITH THREAT DETECTION AND DISCRIMINATION

(71) Applicant: Evolv Technologies, Inc., Waltham, MA (US)

(72) Inventors: Michael Ellenbogen, Wayland, MA (US); Alec Rose, West Hartford, CT (US); Peter Lorenz, Boston, MA (US); Christopher Cahill, Northborough, MA (US)

(73) Assignee: Evolv Technologies, Inc., Waltham, MA (US)

( * ) Notice: Subject to any disclaimer, the term of this patent is extended or adjusted under 35 U.S.C. 154(b) by 0 days.

(21) Appl. No.: 18/085,152

(22) Filed: Dec. 20, 2022

(65) Prior Publication Data

US 2023/0118107 A1    Apr. 20, 2023

Related U.S. Application Data

(63) Continuation of application No. 17/550,170, filed on Dec. 14, 2021, now Pat. No. 11,568,734, which is a
(Continued)

(51) Int. Cl.
*G08B 23/00* (2006.01)
*G01V 3/08* (2006.01)
(Continued)

(52) U.S. Cl.
CPC .............. *G08B 23/00* (2013.01); *G01V 3/08* (2013.01); *G06F 7/72* (2013.01); *G06T 11/60* (2013.01); *G07C 9/38* (2020.01); *G08B 5/22* (2013.01)

(58) Field of Classification Search
CPC . G08B 23/00; G08B 5/22; G01V 3/08; G01V 3/10; G01V 3/17; G06F 7/72;
(Continued)

(56) References Cited

U.S. PATENT DOCUMENTS 5,119,028 A * 6/1992 Mooney ................. G01V 3/165
324/326
6,541,966 B1   4/2003 Keene
(Continued)

FOREIGN PATENT DOCUMENTS

| JP | H10111363 A  | 4/1998 |
|----|--------------|--------|
| JP | 2009534644 A | 9/2009 |
| WO | 2020087019 A1 | 4/2020 |

OTHER PUBLICATIONS

Davidson et al. (Feb. 13, 2018) "On the magnetic polarizability tensor of US coinage", Measurement Science and Technology, 29(3):15 pages.
(Continued)

*Primary Examiner* — James J Yang
(74) *Attorney, Agent, or Firm* — Mintz Levin Cohn Ferris Glovsky and Popeo, P.C.

(57) ABSTRACT

A method includes receiving, from a plurality of magnetic field receivers including magnetic sensors, data characterizing samples obtained by the plurality of magnetic field receivers, the samples of a combination of a first magnetic field and a second magnetic field resulting from interaction of the first magnetic field and an object; determining, using the received data, a polarizability index of the object, the polarizability index characterizing a magnetic polarizability property of the object; classifying, using the determined polarizability index, the object as threat or non-threat; and providing the classification. Related apparatus, systems, techniques, and articles are also described.

20 Claims, 9 Drawing Sheets

Related U.S. Application Data continuation of application No. 16/664,565, filed on Oct. 25, 2019, now Pat. No. 11,232,700.

(60) Provisional application No. 62/751,490, filed on Oct. 26, 2018.

(51) Int. Cl.
| | | |
|---|---|---|
| G06F 7/72 | (2006.01) | |
| G06T 11/60 | (2006.01) | |
| G07C 9/38 | (2020.01) | |
| G08B 5/22 | (2006.01) | |

(58) Field of Classification Search
CPC ...... G06T 11/60; G07C 9/38; G06V 2201/05; G06V 20/52; G01R 33/1223
See application file for complete search history.

(56) References Cited

U.S. PATENT DOCUMENTS

| | | | |
|---|---|---|---|
| 7,545,140 | B2 | 6/2009 | Humphreys et al. |
| 11,232,700 | B2 | 1/2022 | Ellenbogen et al. |
| 11,568,734 | B2 | 1/2023 | Ellenbogen et al. |
| 2003/0137420 | A1 | 7/2003 | Turner et al. |
| 2006/0158331 | A1 | 7/2006 | Massengill et al. |
| 2008/0054893 | A1* | 3/2008 | Humphreys ........... G01V 3/107 324/239 |
| 2010/0277397 | A1* | 11/2010 | Scott ........................ G01D 1/00 343/904 |
| 2013/0006552 | A1* | 1/2013 | Peyton .................... G01V 3/12 702/57 |
| 2016/0131358 | A1 | 5/2016 | Spiro |
| 2020/0135004 | A1 | 4/2020 | Ellenbogen et al. |
| 2022/0101717 | A1 | 3/2022 | Ellenbogen et al. |

OTHER PUBLICATIONS

Makkonen et al. (2013) "Classification of Metallic Targets Using a Single Frequency Component of the Magnetic Polarisability Tensor", Journal of Physics: Conference Series, Institute of Physics Publishing, 450(1):6 Pages.

Makkonen et al. (2015) "Determination of Material and Geometric Properties of Metallic Objects using the Magnetic Polarisability Tensor", IEEE, 5 Pages.

Makkonen et al. (Mar. 27, 2014) "KNN Classification of Metallic Targets Using The Magnetic Polarizability Tensor", Measurement Science and Technology, IOP, 25(5):9 Pages.

Marsh et al. (Mar. 7, 2013) "Three-Dimensional Object Location and Inversion of the Magnetic Polarizability Tensor at a Single Frequency Using a Walk-Through Metal Detector", Measurement Science and Technology, IOP, 24(4):13 Pages.

Rehim et al. (Apr. 13, 2015) "Meaurement System for Determining the Magnetic Polarizability Tensor of Small Metal Targets", IEEE Sensors Applications Symposium (SAS), 5 pages.

* cited by examiner

PERSONNEL INSPECTION WITH THREAT DETECTION AND DISCRIMINATION

RELATED APPLICATIONS

This application is a continuation of and claims priority under 35 U.S.C. § 120 to U.S. patent application Ser. No. 16/664,565, filed on Oct. 25, 2019, and granted as U.S. Pat. No. 11,232,700 on Jan. 25, 2022, which claims the benefit of and priority under 35 U.S.C. § 119 to U.S. Provisional Patent Application No. 62/751,490 filed Oct. 26, 2018, the entire contents of which are hereby expressly incorporated by reference herein.

TECHNICAL FIELD

The subject matter described herein relates to a personnel inspection system, which in some example implementations, can be capable of performing threat detection and discrimination without personal item divestment.

BACKGROUND

Airport security attempts to prevent any threats or potentially dangerous situations from arising or entering the country. Some existing radio frequency (RF) imaging systems (such as those utilized by airport security for passenger screening) are large, expensive, and require individuals to remain stationary while an antenna rotates around the stationary individual to capture an image. In addition, these existing RF imaging systems can require divestment of personal items such as cell phones, keys, wallets, and the like, by the individual under inspection. Such divestment requirement can reduce throughput and usability of the imaging systems.

Some existing inspection systems, such as walkthrough metal detectors, can include coils to generate and measure changes in a magnetic field caused by magnetic or conductive materials (e.g., metallic) passing through the magnetic field. These existing inspection systems can be capable of measuring for metallic objects passing through a threshold but can lack any ability to distinguish personal items such as a cell phone, laptop, keys, belt buckle, and the like from threats, such as fire arms or improvised explosive devices. Accordingly, these example existing inspection systems require divestment of personal items thereby limiting their throughput and usability.

SUMMARY

In an aspect, a method includes receiving, from a plurality of magnetic field receivers including magnetic sensors, data characterizing samples obtained by the plurality of magnetic field receivers, the samples of a combination of a first magnetic field and a second magnetic field resulting from interaction of the first magnetic field and an object; determining, using the received data, a polarizability index of the object, the polarizability index characterizing a magnetic polarizability property of the object; classifying, using the determined polarizability index, the object as threat or non-threat; and providing the classification.

One or more of the following features can be included in any feasible combination. For example, the polarizability index of the object can characterize at least a shape, a permeability, and a conductivity of the object. The polarizability index of the object can include a complex tensor including at least six elements characterizing directional polarizability components of the object at one or more frequencies employed by the transmitting system. Determining the polarizability index can include solving a set of trial solutions via a precomputed pseudo-inverse, determining a residual for each of the trial solutions, and selecting the trial solution resulting in a smallest residual. Determining the polarizability index can include defining a set of trial solutions, each trial solution including a location, a speed, and a time-shift; calculating an associated polarizability index and an associated residual for each trial solution; and selecting a final trial solution, the final trial solution including the trial solution of the set of trial solutions that is associated with the smallest residual. The method can further include localizing the object within a volume under inspection, the localization including determining an object speed, an object position, and an object time-offset to a predetermined plane. The method can further include generating one or more signals for driving a magnetic field transmitter at a frequency that is less than 1,000 Hertz (Hz).

The plurality of magnetic field receivers can include flux gate sensors that measure a magnitude and phase of the combination of the first magnetic field and the second magnetic field in at least three axis at locations of the plurality of magnetic field receivers. The samples obtained by the plurality of magnetic field receivers can characterize a magnitude and a phase. Classifying, using the polarizability index, the object as threat or non-threat can include comparing the magnitude, the phase, and the polarizability index to a library of predetermined threat signatures. The first magnetic field can be generated by at least a first magnetic field transmitter and a second magnetic field transmitter. The first magnetic field transmitter and the second magnetic field transmitter can be oriented in a first direction. The first magnetic field transmitter and the second magnetic field transmitter can be spatially offset transverse to a predefined direction of motion and transverse to the first direction.

In another aspect, a system can include a magnetic field transmitter configured to generate a first magnetic field; a plurality of magnetic field receivers including magnetic sensors, the plurality of magnetic field receivers configured to sample a combination of the first magnetic field and a second magnetic field resulting from interaction of the first magnetic field and an object; and at least one data processor configured to at least: receive data characterizing the samples obtained by the plurality of magnetic field receivers; determine, using the received data, a polarizability index of the object, the polarizability index characterizing a magnetic polarizability property of the object; classify, using the polarizability index, the object as threat or non-threat; and provide the classification.

One or more of the following features can be included. For example, a transmit driver can be coupled to the magnetic field transmitter and configured to generate one or more signals for driving the magnetic field transmitter at a frequency that is less than 1,000 Hertz (Hz). The transmit driver can be configured to generate one or more signals for driving the magnetic field transmitter at a first frequency and a second frequency. The magnetic field transmitter can be driven at the first frequency and the second frequency. The first frequency can be between 5 Hz and 40 Hz and the second frequency can be between 100 Hz and 1000 Hz. A second magnetic field transmitter can be included. The transmit driver can include: first drive electronics to drive the magnetic field transmitter; and second drive electronics to drive the second magnetic field transmitter. The samples can be obtained by the plurality of magnetic field receivers and can characterize a magnitude and a phase. Classifying, using the polarizability index, the object as threat or non-threat can include comparing the magnitude, the phase, and the polarizability index to a library of predetermined threat signatures.

The plurality of magnetic field receivers can include flux gate sensors that measure a magnitude and phase of the combination of the first magnetic field and the second magnetic field in at least three axis at locations of the plurality of magnetic field receivers. A data acquisition base station can be included, coupled to the plurality of magnetic field receivers, and configured to filter, demodulate, and digitize the samples obtained by the plurality of magnetic field receivers. The data acquisition base station can be further configured to determine in-phase and quadrature data characterizing the second magnetic field. Determining the polarizability index can include determining a polarizability tensor. Determining the polarizability index can include solving a set of trial solutions via a precomputed pseudo-inverse, determining a residual for each of the trial solutions, and selecting the trial solution resulting in a smallest residual.

The at least one data processor can be further configured to: localize the object within a volume under inspection, the localization including determining an object speed, an object position, and an object time-offset to a predetermined plane. Determining the polarizability index can include: defining a set of trial solutions, each trial solution including a location, a speed, and a time-shift; calculating an associated polarizability index and an associated residual for each trial solution; and selecting a final trial solution, the final trial solution including the trial solution of the set of trial solutions that is associated with the smallest residual. The at least one data processor can be further configured to determine a measure of distortion of the second magnetic field based on an amount of metal present at a location where the system is deployed.

The system can further include a base plate configured to couple a first post and a second post. The magnetic field transmitter can be coupled to the first post and the plurality of magnetic field receivers can be coupled to the second post. The base plate can include a modular mounting system configured to couple the base plate to a surface upon which the base plate is positioned. The modular mounting system can include at least one of a plurality of suction cups, a plurality of gripping mechanisms, a plurality of piercing mechanisms, and a plurality of auger mechanisms. The base plate can include a base plate frame hidden within the base plate. The base plate frame can be configured to permanently install the base plate in a location where the system is deployed. A proximal end of the first post and a proximal end of the second post can be coupled to the base plate. A distal end of the first post and a distal end of the second post are not connected to an archway coupling the distal end of the first post to the distal end of the second post. At least one of an accelerometer or an inclinometer can be coupled to the first post and/or the second post.

The system can further include at least one camera coupled to the first post or the second post. The at least one camera can be configured to capture image and/or video data of the object. The camera can be selected from a group including a depth camera, a rear-facing camera, a fish-eye camera, an infrared camera, a thermal camera, a surface map camera, an electro-optical camera, and a stereo camera. The system can include a first camera coupled to the first post and a second camera coupled to the second post. The first camera can be configured to capture image at a first viewing angle and the second camera can be configured to capture image data a second viewing angle. The second viewing angle different than the first viewing angle. The image data captured by the first camera and the second camera is registered within a coordinate system of the system. Responsive to classifying the object as a threat, the processor can be further configured to generate a graphical indication identifying a location of the object and to overlay the graphical indication atop the image data in a display.

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

Like reference symbols in the various drawings indicate like elements.

DETAILED DESCRIPTION

Figure 1:
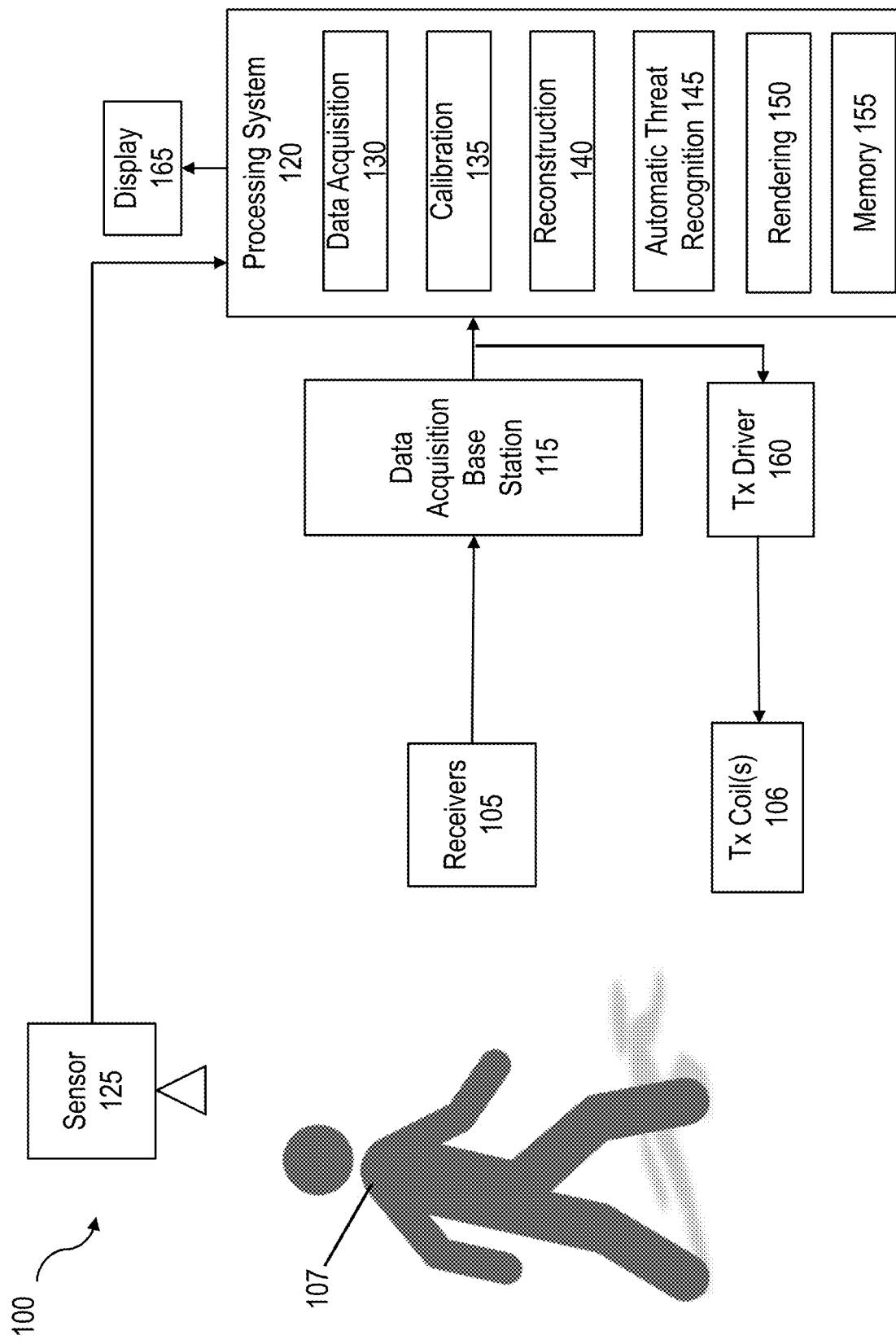
FIG. 1 is a system block diagram of an example personnel inspection system that can be capable of performing threat detection and discrimination without personal item divestment.

Personnel inspection systems are used to detect threats which can be introduced to particular area the inspection system seeks to protect. A common personnel inspection system can include, for example, a metal detector configured at an entrance to a courthouse or a stadium, or a body scanner at airport. These inspection systems are configured to generate data that can be processed to determine an absence of a threat. A threat can be considered any individual, object or element passing through the system, which if allowed to enter the protected area can cause damage, introduce security concerns, and/or disrupt events or activities occurring in the protected area. For example, a firearm is a threat which personnel inspection systems seek to detect at airports or stadiums. Typically, personnel inspection systems are configured to detect threats which include metallic objects.

Traditional personnel inspection systems have a number of drawbacks. Personnel inspections systems are commonly configured to scan or evaluate data associated with a single individual at a time, such as a queue of individuals at a security area of the airport. Each individual must be scanned or processed before another individual can be scanned or processed for threat detection, which can result in delays and long wait times to enter the protected area. Individuals commonly experience elevated levels of anxiety and distrust when being evaluated for the presence of potential threats in traditional personnel inspection systems.

Traditional personnel inspection systems also require individuals to remove all potential clutter objects, such as any metal objects, prior to entering the area at which the inspection system is deployed. In this way, traditional inspection systems can broadly identify a potential threat as any detected metal object that may remain on an individual passing through the inspection system without discriminating for the size, type, or composition of the object. Using this type of broad, binary discrimination threshold can result in large rates of false alarms and require individuals to undergo subsequent inspection processing to clear objects that were inaccurately identified as threat objects. For example, traditional inspection systems cannot typically discern the object and material properties of a belt buckle uniquely from those of a firearm. In traditional inspection systems, both objects are equally detected and characterized as potential threats, yet the belt buckle poses much less of a threat, or even no threat, compared to the firearm. Individuals typically have a number of metal objects on their body which may be falsely identified as threats in traditional inspection systems. Shoe or boot grommets, belt buckles, glasses, as well as cell phones, laptops, hearing aids, and pacemakers all include metal which traditional inspection systems may falsely identify as detected threats. As a result, personnel inspection systems require all potential threat objects to be removed or divested from the individual passing through the inspection system.

The current subject matter can include an improved personnel inspection system, which in some example implementations, can be capable of performing threat detection and discrimination in high clutter environments in which individuals may be carrying personal items such as cell phones and laptops and without personal item divestment. In some implementations, a personnel inspection system can perform threat detection and discrimination with high throughput that allows individuals to pass through the detector at normal walking speeds such that individuals are not required to slow down for inspection and, in some implementations, the inspection threshold can allow for multiple individuals to pass through the threshold side-by-side (e.g., two or more abreast).

Advantages of this improved personnel inspection system can include higher throughput of individuals being evaluated, reduced incidence of false alarms due to more accurate discrimination of metal objects as threats or non-threats, and reduced stress levels and improved emotional response for individuals being evaluated using the improved personnel inspection system. In addition, the improved personnel inspection system can more accurately distinguish metal objects present on an individual passing through the improved inspection system as threats or non-threats without requiring the individual to remove the metal object from their body. The data that is collected, processed, and generated by the improved inspection system can also be used within the context of other security-focused operations such as notification to system operators of individuals who are in possession of a detected threat object, training exercises for inspection system operators or supervisors, as well overall process improvement of security procedures which may occur prior to or after individuals are screened or evaluated using the improved inspection system.

Some example implementations of the improved inspection system disclosed herein can include a continuous-wave magnetic detection system of high sensitivity, capable of detecting disturbances in its transmitted field of up to one part in 10,000. To facilitate this sensitivity, the system can be configured to transmit a stable magnetic field and to measure the transmitted magnetic field using a low-noise method, as magnetic disturbances caused by unintentional system noise can be very difficult to distinguish from magnetic disturbances caused by metallic objects. In this context, system noise can encompass a number of signal interferences, including traditional electronic noise, amplitude variations in the transmitted magnetic field, and/or digital error, which can be introduced by harmonic mismatches between intentional signals and sampling rates associated with analog to digital conversion.

Some example implementations can include an active magnetic system that can acquire a series of magnetic field measurements of an observational domain; determine in-phase and quadrature components of the magnetic field measurements; determine a measure of polarizability (e.g., a polarizability tensor, polarizability index) of an object in the observational domain; localize the object including determining speed, position, and time offset of the object; and perform threat detection and/or discrimination of the object in the presence of clutter using the magnetic field measurements, the polarizability, and/or the localization information. In some implementations, the system can be configured to detect for firearms and/or improvised explosive devices (IEDs).

In some implementations, the system can determine a polarizability of objects under inspection and can perform threat detection and discrimination (e.g., classification) using the polarizability of the objects. By determining and utilizing the polarizability of objects, certain threats, such as fire arms and improvised explosive devices, can be more accurately detected, resulting in improved personnel inspection systems.

In personnel inspection systems configured with magnetic-field sensing to detect illegal or threat objects, such as firearms, the frequency band that is used to optimize the signal-to-noise (SNR) ratio is not the same as the frequency band that is used to optimize discrimination between threat and non-threat objects. In addition, one or both of the optimized frequency bands can be too low to be effectively detected by the receivers of the system. A challenge in personnel inspection systems configured with magnetic-field sensing can include determining how best to measure for detected threat objects at the appropriate frequency band while retaining the benefit provided by both optimized frequency bands.

The improved inspection system described herein can be configured to interrogate an object in such a way that it gets information in a first frequency band with good SNR properties, as well as a second frequency band with good discrimination properties, the first frequency band being distinct from the second frequency band. The use of fluxgates, either in addition to or instead of induction-coil receivers, can allow the system disclosed herein to measure very low frequency (e.g., sub 1 kHz) magnetic fields. By using frequency band measurements from the first frequency band with good SNR properties to determine certain properties of the object (such as its location, speed, orientation, or the like), before recovering additional properties of the object via the second frequency band with good discrimination properties. Some example implementations of the magnetic sensing algorithm and the system described herein can exploit the benefits of both frequency bands simultaneously.

For example, many consumer electronics contain non-ferrous metals like aluminum and copper, while many firearms contain ferrous metals like steel. Due to the fact that eddy currents scale with frequency, the maximum distinction between ferrous and non-ferrous metals can be achieved by exciting an object with magnetic fields at very low frequencies (sub 1 kHz). Such low frequencies can be efficiently measured using fluxgate receivers as compared to induction-coils, which are simpler and easier to build at higher frequencies. However, fluxgate receivers (and their digitizing electronics) often have noise characteristics that get better at higher frequencies. The system and magnetic sensing algorithm described herein utilize frequency measurements at low frequencies (e.g., ~30 Hz) and at higher frequencies (e.g., ~230 Hz). For example, the system and magnetic sensing algorithm described herein can utilize frequency measurements between about 5 and 100 Hz and between and between about 100 and 1000 Hz to simultaneously exploit enhanced discrimination characteristics of low frequencies and the superior SNR of the high frequencies to improve metal object detection and discrimination. Accordingly, in some implementations, the system can operate at frequencies below 1 kilo hertz (Hz) in order to improve performance of detecting and discriminating firearms in the presence of common personal items such as cell phones. At relatively lower frequencies (under 1 kHz, for example), magnetic contributions to the magnitude of polarizability can dominate over conductive contributions to the magnitude of polarizability. As a result, the signal magnitude may be driven less by the total metallic content of a threat than by the material that is unique to the characteristics of many threats and absent from typical consumer electronics.

The above description of the processing performed by the inspection system and magnetic sensing algorithm described herein can be further considered with regard to a single object passing through the inspection system. The single object will have some properties that vary with frequency, such as material properties and/or magnetic dipole moments and/or polarizability tensor elements and will have some properties that are shared across the frequency bands such as location, orientation, and speed. The inspection system and magnetic sensing algorithm described herein provide enhanced detection capabilities by using measurements for determining the frequency-invariant properties of the object, and using the good discrimination properties primarily for classification.

In some implementations, the magnetic sensing algorithm described herein is configured to initially perform a retrieval operation at a frequency band with favorable SNR characteristics to solve for location, orientation, and speed, and subsequently retrieves an object signature, such as material properties, magnetic dipole moments, and/or a polarizability tensor or index of the object at the other frequency band. Information determined from the first retrieval operation can be used to constrain the second retrieval and improve the overall accuracy of detection.

In other implementations of the magnetic sensing approach described herein, the magnetic sensing algorithm can retrieve all object properties in a single step by using a weighted cost function that evaluates the higher frequencies more closely for the frequency-invariant properties. In both implementations, the properties of the object at the more discriminating frequency band will be recovered with greater fidelity than if they had been recovered independently. Subsequently, these properties can be used in a classification step that decides if the object belongs to a particular category, such as firearm or consumer electronic device.

FIG. 1 is a system block diagram of an example inspection system 100 that can be capable of performing threat detection and discrimination without personal item divestment.

As shown in FIG. 1, the system 100 includes magnetic receivers 105 coupled to a data acquisition base station 115. The data acquisition base station 115 can be configured to filter, demodulate, and digitize the magnetic field measurement data received from the receivers 105. The transmitters 106 and magnetic receivers 105 can be arranged to probe an observational domain (OD) 107, sometimes referred to as a "scene", such as a threshold or other defined region. The OD 107 can be considered to include voxels defining a volume. The OD 107 can be a single continuous region or multiple separate regions. The system 100 also include transmitters 106 coupled to a transmission driver 160. The transmission driver 160 can be configured to generate a signal to drive transmitters 106. The system 100 also includes a processing system 120 configured to analyze the received magnetic field measurements. The processing system 120 includes a data acquisition module 130, a calibration module 135, a reconstruction module 140, an automatic threat recognition module 145, a rendering module 150, and a memory 155. The system 100 can also include a display 165 for providing output; and a sensor 125 to provide additional inputs to the system 100.

In some implementations, the system can be configured to operate as a distributed lock-in amplifier, utilizing a synchronous homodyne digital dual-phase demodulation technique to accurately extract in-phase (I) and quadrature (Q) information from the system's specific transmitted frequencies. Demodulation can be achieved by digitally mixing or multiplying the desired signal with a reference signal and subsequently filtering the result using a low-pass filter. The reference signal can be a directly measured signal related to or derived from the driving signal used in the transmitter, or can be a synthetic analogue. By utilizing two versions of the reference signal, one phase shifted or time-delayed from the other, the amplitude, phase, and/or I and Q of the measured signal can be reconstructed.

In some implementations, the transmission driver 160 can include a combined set of digitally-controlled high-accuracy direct digital synthesis (DDS) waveform generators, a digitally-controlled summing programmable-gain amplifier (PGA) circuit, and a closed-loop class-D power amplifier with enhanced power supply rejection ratio (PSRR). Such a system provides flexibility in the frequency and amplitude of the transmitted waveforms while achieving high stability in the transmitted magnetic fields required to meet necessary signal-to-noise ratios in the measured data. The system 100 can digitally control an amplitude and a frequency of the transmitted magnetic fields. Digitally controlling the amplitude and the frequency of the transmitted magnetic field can be performed in a dynamic manner and in an arbitrary or ad-hoc manner. In some implementations, the system can include a closed-loop microcontroller-based feedback system configured to measure and dynamically adjust the per-frequency amplitude of the transmitted field thereby increasing the stability and predictability of the system.

Transmitters 106 can include at least two wire-loop transmitters capable of generating a magnetic field according to a driving signal having an operating (e.g., characteristic) frequency (e.g., a modulation frequency). The transmitters 106 can operate at 30 Hz and 130 Hz, for example. In general, a wire-loop can be considered to reside within a primary plane. In some implementations, the system 100 can include transmitters arranged to deliver fields with sufficient diversity to probe all cardinal directions (e.g., cartesian coordinates) throughout the OD 107. In a static system where objects under inspection are stationary, at least three transmitters can be included that are either oriented orthogonally (e.g., the primary plane of each of the three transmitters can be oriented orthogonal to one another), or else offset in space. If the object is undergoing motion in a particular direction, as in an object passing through the inspection system 100, two transmitters can be used if they are oriented orthogonal to the direction of motion or spatially offset transverse to both the direction of motion and their shared orientation. This configuration represents a reasonable constraint on object motion (e.g., in one direction) and can further represent the fewest number of transmitter coils capable of achieving sufficient field diversity to fully probe a given object.

As shown in FIG. 1, the transmitter driver 160 can generate one or more signals for driving the transmitters 106. In some implementations, the transmitters 106 can be driven by cycling through the transmitters in time, driving one, then another, until all desired measurements are captured. A benefit of such approach can include that the drive electronics can be shared across all of the transmitters 106. However, this approach can impose a duty-cycle on each transmitter 106, reducing its signal-to-noise ratio. In such a configuration, the transmitters 106 may not be measured at the same instant in time, which, if the object is in motion, may introduce motion-induced artifacts.

In some implementations, the transmitters 106 can be driven simultaneously, but at slightly (e.g., 10 Hertz (Hz)) offset frequencies. The frequencies can be offset enough such that they can be distinctly demodulated in post-processing, which can be set by the bandwidth necessary to resolve the object's motion, which can be about 5-10 Hz for objects moving at typical walking speeds of 1.3 meters per second (m/s). At the same time, the frequencies can be chosen to be similar enough that dispersion in the polarizability is negligible. In some implementations, the offset can be 10 Hz, which can be considered a negligible difference at all but vanishing frequencies. In this example frequency multiplexing approach, the transmit driver 160 can include separate drive electronics to drive each transmitter separately, which can enable improved signal-to-noise ratios without (and/or reducing) the risk of motion blur.

In some implementations, the transmission driver 160 can be capable of generating driving signals that can be distributed to transmitters 106, which can establish a fully phase coherent measurement system across all receive-transmit pairs. In addition, the driving signal can be provided as a reference signal routed from the transmitter driver 160 to the data acquisition base station 115, which can be utilized for demodulation, as described more fully below.

The magnetic receivers 105 can include flux gate sensors, which can directly measure the magnetic field (e.g., magnitude and phase) as compared to wire coils, which measure a rate of change of magnetic field. In some embodiments, one or more of the receivers 105 can include 3-axis flux gate magnetometers. In some embodiments, one or more of the receivers 105 can include 2-axis flux gate magnetometers.

Flux gate magnetometers can be advantageous in that they can operate with high sensitivity, high linearity and a low noise floor as compared to coil receivers. The receivers 105 can provide accurate magnetic measurement at frequencies too low for traditional methods.

A flux gate sensor can measure the amplitude of a magnetic field in three axis (e.g., x, y, and z) at the location of the flux gate sensor. A flux gate sensor can include a sense coil surrounding an inner drive coil that is closely wound around a highly permeable core material, such as mu-metal. An alternating current can be applied to the drive winding, which can drive the core in a continuous repeating cycle of saturation and unsaturation. In the presence of an external magnetic field, with the core in a highly permeable state, such a field is locally attracted or gated through the sense winding. This continuous gating of the external field in and out of the sense winding induces a signal in the sense winding, whose principal frequency is twice that of the drive frequency, and whose strength and phase orientation vary directly with the external field magnitude and polarity.

In some implementations, flux gate sensors can be utilized with operating frequencies below 1 kHz, such as 130 Hz and 30 Hz. At these relatively low operating frequencies, flux gate sensors can operate with improved noise-floors, for example, some flux-gates can achieve a volt-to-field ratio on an order of 20 micro-Volts/nano-Tesla.

Data acquisition base station 115 can demodulate, filter, and digitize data received from receivers 105. The data acquisition base station 115 can aggregate the received data, determine in-phase and quadrature data (I and Q data, respectively) from the received and aggregated digitized data, and transmit the aggregated data as in-phase and quadrature data to processing system 120. Filtration and amplification of the raw magnetometer signals provided to the data acquisition module 130 allows the system to achieve high dynamic range in frequencies of interest, e.g., frequencies below 1 kHz, such as 130 Hz and 30 Hz, by rejecting large ambient direct current (DC) magnetic signals. The bandwidth and design of the filters used in the hardware and/or the software of the system 100 can be selected to reject unwanted signals in the environment, such as 50 and 60 Hz signals generated by alternating current (AC) lines, while maintaining sufficient bandwidth in the demodulated signal to recover the motion of the object.

Sensor 125 can include an infrared (IR) camera, thermal camera, ultrasonic distance sensor, video camera, electro-optical (EO) camera, and/or surface/depth map camera. Sensor 125 creates an additional information image or video, such as an optical image, of at least the OD 107. In some implementations, sensor 125 transmits images or video to processing system 120 for further analysis. System 100 can include multiple sensors 125. Sensor 125 can also be used to detect for the presence of a target in the OD 107. Detecting the presence of a target in the OD 107 can be used to trigger scanning by the system 100. In some implementations, sensor 125 can include a radio frequency identification (RFID) reader.

The system can also present an image to an operator via display 165 in which the visible portion of the visitor and/or their belongings most likely to contain the object(s) is segmented, highlighted, or otherwise made to provide notice to an operator and aid in the operator's response. In addition, aspects of the object can be determined based on the images obtained from the depth camera. The obtained aspects can be associated with classification of the object. For example, if the object is in plain view, the magnetic sensing algorithm can determine the object class, such as determining that the object is a laptop or an umbrella. If the object is concealed, the magnetic sensing algorithm can determine a part of the person's body or a location on the person where the object is concealed, such as a pocket of the person's clothing, an ankle or wrist of the person, or a bag that the person may be carrying. Data associated with these locations can be combined with information derived from the magnetic field data in a classification step that uses all available information to achieve greater predictive accuracy during threat detection.

Processing system 120 includes a number of modules for processing magnetic field data and additional information images from sensor 125 of the OD 107 including data acquisition module 130, calibration module 135, reconstruction module 140, automatic threat recognition module 145, rendering module 150, and a memory 155.

Data acquisition module 130 acquires a time-series of voltage measurements which represent magnetic field measurements from the DAS base station 115 and additional information images from the sensor 125. In some implementations, the sampling rate of the data acquisition module 130 is derived from the same master clock used to generate the transmitted fields via the transmitters 106. For each receiver 105, data acquisition module 130 derives I and Q data from this time-series in post-processing via demodulation with an accompanying reference signal. Timing of the I and Q data can be synchronized across receivers 105 and data acquisition module 130 can publish the synchronized data as frames (e.g., time slices) for further analysis by system 100.

In some implementations, the master clock of the system 100 can be distributed across multiple meters of space in the system, using an internal network of low-jitter low-skew clock fanouts and low voltage differential signaling (LVDS) converters. This configuration can enable a sampling rate to be an integer harmonic of every transmitted frequency, eliminating digitization errors which otherwise damage the sensitivity of the system. By configuring each device in the data acquisition process 130 on the same clock domain, receivers 105, which can be located meters apart, can be correctly assumed to be receiving samples at the same time intervals, with no drift due to frequency mismatching. Thus, for a given frame, data acquisition module 130 publishes a set of data for each receiver 105 and sensor 125. In some implementations, data can be acquired and frames can be published at a rate sufficient to resolve the carrier frequencies.

In some implementations, data acquisition module 130 removes the static background signal (e.g., the primary field). In some implementations, the data acquisition base station 115 can remove the static background signal (e.g., the primary field) such that the I and Q data characterizes the secondary field and not the primary field.

Calibration module 135 applies calibration correction to the published data. Calibration corrections can include compensating the published data for serial time-sampling. In addition, calibration module 135 can compare measured primary fields to one or more field model predictions, and compensate for any differences. In some implementations, calibration can account for amplitude and phase changes of the transmitters that occur due to normal wear and tear, manufacturing variations, or temperature changes.

Reconstruction module 140 transforms the calibrated data into images and/or feature maps. An image can be created for each receiver 105, and/or based on a composite of measurements obtained by multiple receivers 105. The reconstruction module 140 can include determining the polarizability measure (e.g., tensor) and localization of an object.

Polarizability can be characterized as a proportionality constant relating an object's far-field response to a primary field that induced it. It can have units of volume, and can depend on the shape, permeability, and conductivity of the object, as well as the frequency of the applied field. In order to determine the polarizability, in some implementations, a best-fit algorithm can be utilized to implement a minimum residual matched filter.

The transmitter fields can be calculated from models of rectangular coils. The receiver fields can be calculated from dipole fields along the particular axis of the sensor, such that a 3-axis receiver node is treated like 3 independent and orthogonal dipoles.

In some implementations, image data from the sensor 125 can be used to further enforce the sparsity constraint beyond that supplied by a-priori knowledge of items or subjects that may occupy the OD 107. Specifically, an image of the OD 107 acquired by sensor 125 can be used to determine a spatial location of the target (e.g., which voxels of the OD 107 the target resides in and which voxels of the OD 107 are empty). Empty voxels contain no objects and therefore can be considered zero for compressed sensing (e.g., enabling better and/or quicker estimations of the solution to the underdetermined linear system).

In addition, an appropriate sized OD 107 can result in a scene that is sufficiently sparse for compressed sensing. For example, if an OD 107 is a volume that is 2 meters by 1 meter by 0.5 meters, and is divided into 8,000,000 voxels of 5 mm, a typical human located within this OD 107 would occupy only about 10% of the voxels at any moment (e.g., approximately 800,000 voxels). A retrieved set of polarizable objects from a sensor 125 can be used to determine three-dimensional surfaces within the OD 107 volume and consequently which voxels the individual resides in. The empty voxels can be forced to zeros when retrieving the set of polarizable objects while non-zeroed voxels can be altered during reconstruction (e.g., can be considered variables to find an optimal reconstructed solution to the underdetermined linear system).

Reconstruction module 140 can reconstruct one or more magnetic retrieved set of polarizable objects. In addition, reconstruction module 140 can create aggregate retrieved set of polarizable objects by combining multiple independent retrieved sets of polarizable objects. In some implementations, reconstruction module 140 can treat all receivers 105 as one large sparse aperture and reconstruct a single retrieved set of polarizable objects using the information acquired from all receivers 105 in the single aperture.

Reconstruction module 140 can perform localization of the object using multiple time-slices. Such an approach can use a single model-fitting approach that solves for the objects location (e.g., x, y, and t-crossing), speed, and polarizability tensor. An example localization approach is described more fully below.

Reconstruction module 140 can generate feature maps from the reconstructed images. Feature maps can include characterizations or features of the magnetic measurements. Statistical analysis can be performed across multiple images. Some example features include field magnitude, field phase, and polarizability tensor properties (discussed further below). Other features are possible.

Automatic threat recognition module 145 analyzes the images and/or feature maps for presence of threat objects. Threat objects can include dangerous items that an individual may conceal on their person, for example, firearms and explosives. Automatic threat recognition module 145 may identify threats using, for example, a classifier that assesses the feature maps generated by reconstruction module 140. The classifier may train on known threat features. In some implementations, the threat recognition process can compare the determined images to a library of predetermined polarizability signatures.

In some implementations, features (e.g., classification variables) can include field magnitude, phase, and polarizability tensor properties at one or more operating frequencies.

Rendering module 150 generates or renders an image characterizing the outcome of the threat recognition analysis performed by the threat recognition module 145. The image can be rendered on display 165. For example, rendering module 150 can illustrate an avatar of a scanned person and any identified threats. Rendering module 150 can illustrate a characterization that automatic threat recognition module 145 did not detect any threats.

Figure 2:
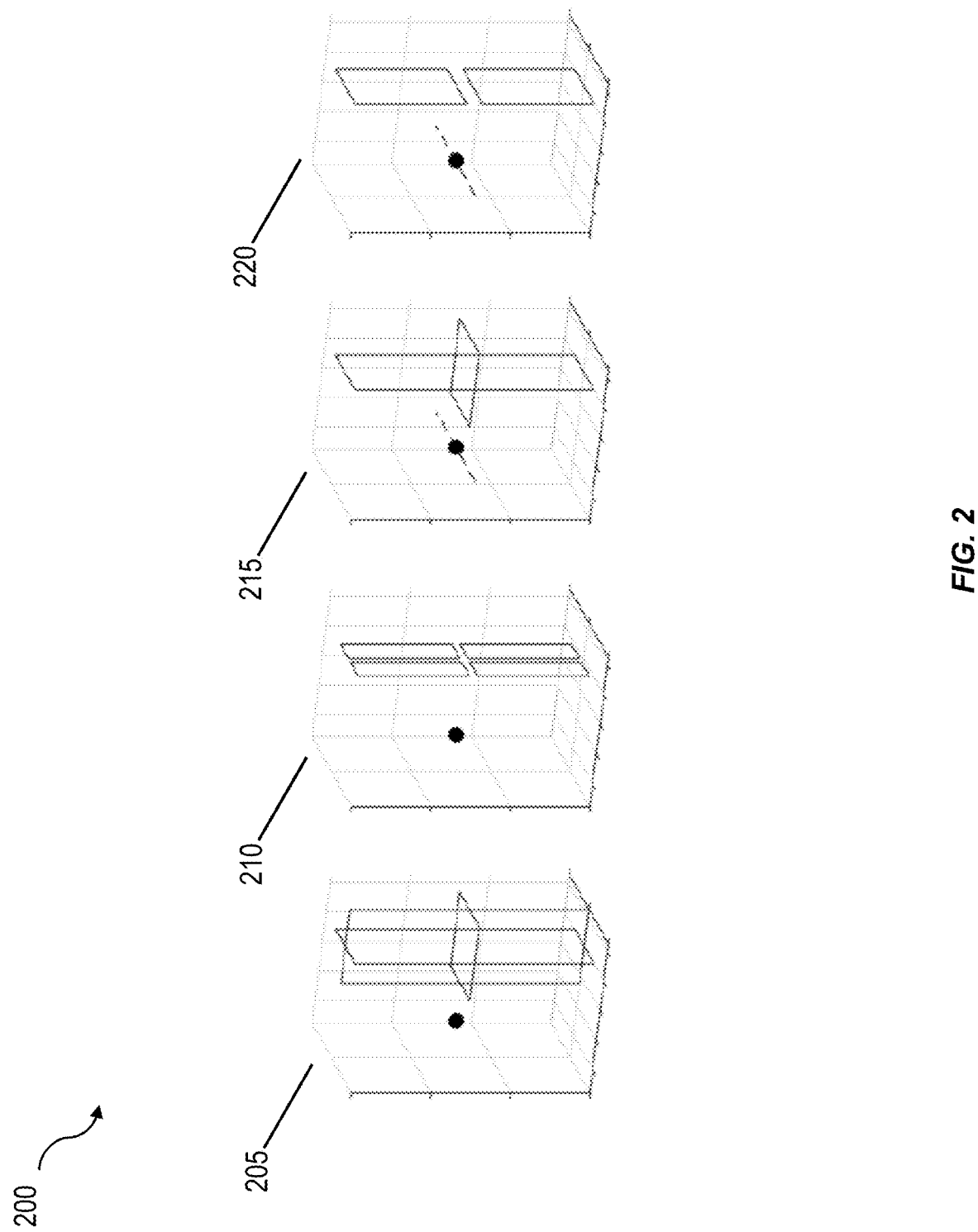
FIG. 2 is a diagram illustrating four example plots of transmitter spatial arrangements.

FIG. 2 is a diagram illustrating four example plots of transmitter spatial arrangements. In plot 205, three transmitters are arranged such that they are oriented orthogonally to each other and thus the configuration of 205 is capable of measuring all dimensions of a static (e.g., stationary) object. In plot 210, four transmitters are arranged such that they are oriented in the same plane but are offset in space and thus capable of measuring all dimensions of a static object. In plot 215, two transmitters are arranged orthogonal to one another and thus capable of measuring all dimensions of an object in motion. Similarly, in plot 220, two transmitters are arranged such that they are oriented in the same plane but are offset in space and thus capable of measuring all dimensions of an object in motion. As discussed in more detail below, in some implementations, system 100 can include transmitters 106 arranged according to the configuration illustrated in plot 220. Such a configuration can provide, in some implementations, a desirable form factor and reduced cost.

Figure 3:
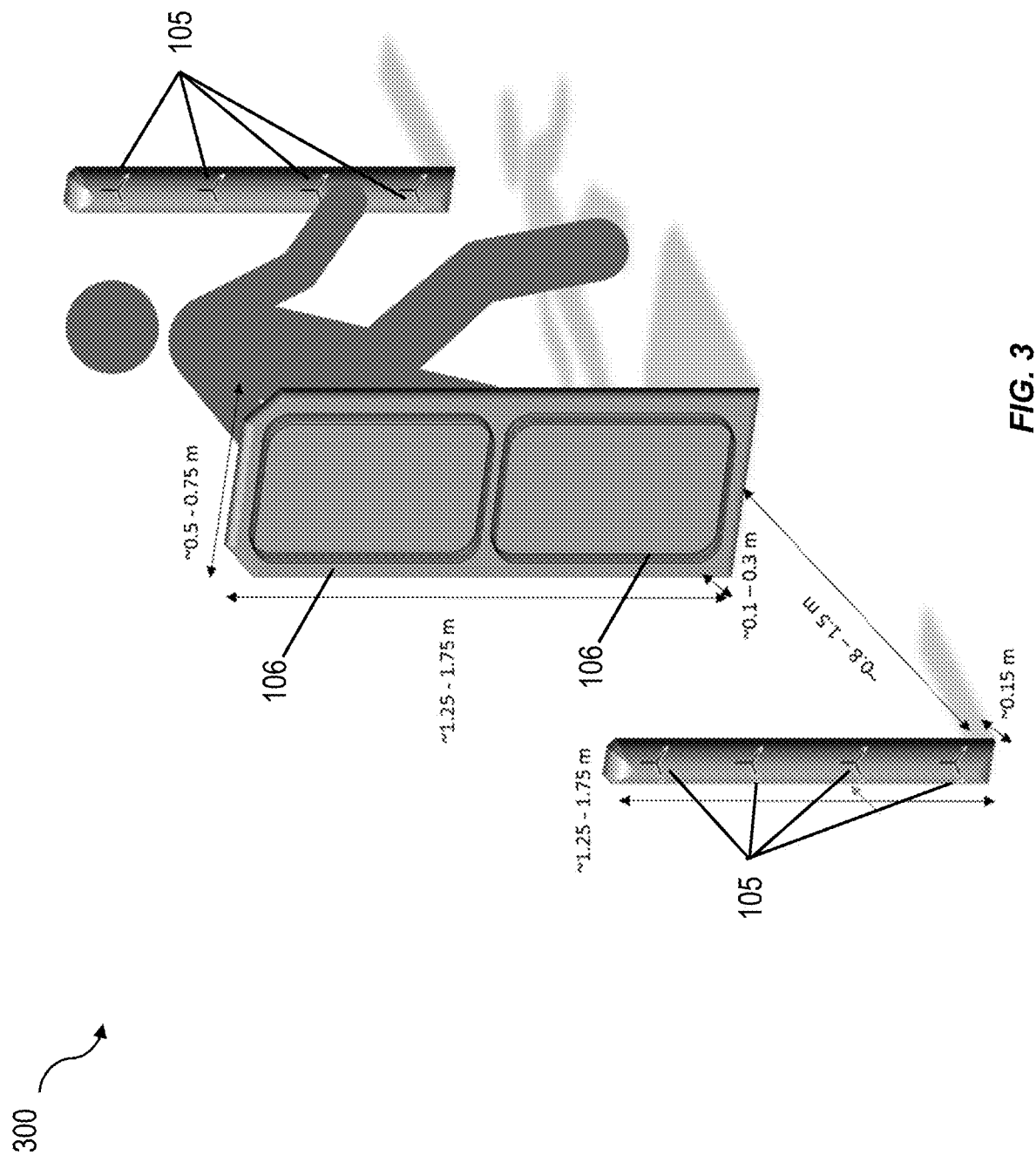
FIG. 3 is a diagram illustrating an arrangement of an example personnel inspection system according to some implementations.

FIG. 3 is a diagram illustrating an arrangement of an example personnel inspection system 300 according to some implementations. Two transmitters 106 are arranged such that they are oriented in the same plane but are offset in space and thus capable of measuring all dimensions of an object in motion. In the example, the transmitters 106 are coils capable of transmitting between 20 and 1,000 Hz, and can be configured to transmit multiple signals offset in frequency so as to operate simultaneously. For example, the transmitters 106 can operate at 30 Hz and 130 Hz. Other offset frequencies are possible, for example, 5-10 Hz. In some implementations, the transmitters 106 can operate at (e.g., be driven at) a first frequency between 20 Hz and 40 Hz and at a second frequency between 120 Hz and 140 Hz. Considerations for selecting frequencies can include that lower frequencies increase the relative magnitude of ferrous compared to non-ferrous metals, higher frequencies can have better noise floors for certain fluxgate sensors, and particular frequencies (e.g., 50 and 60 Hz, harmonics) can be avoided entirely due to interference in typical environments. Receivers 105 are arranged vertically on posts (e.g., vertical poles) on either side of the transmitter to provide for dual lanes to allow individuals under inspection to pass through the system.

In order to recover a magnetic signature of a detected object independent of the location and orientation of the object, it can be desirable to collect measurements of the object while it is being exposed to magnetic fields which are transmitted into the object from orthogonal directions. By arranging the configuration of the transmitters 106 shown in FIG. 3 in an orthogonal manner, the total number of coils and overall complexity of the inspection system can be reduced, which can reduce overall operating and maintenance costs as well as the size of the physical footprint of the inspections system.

The configuration of transmitters 106 shown in FIG. 3, can enable some example systems disclosed herein to collect measurements of an object while it is interrogated by magnetic fields in largely orthogonal directions so that a magnetic signature can be determined that is largely independent of location and orientation of the object. At the same time, the total number of coils and complexity of the system can be minimized for the sake of cost and physical footprint. Field diversity can be achieved in the system with a minimal configuration of transmitters, for example two transmitters, by exploiting the motion of the object past the transmitters. In addition, the system complexity can be further reduced by powering the two transmitters simultaneously via orthogonal time-varying patterns, such as two sinusoids with slightly offset frequencies. The frequencies can be similar enough that dispersion in the polarizability index is negligible.

Figure 4:
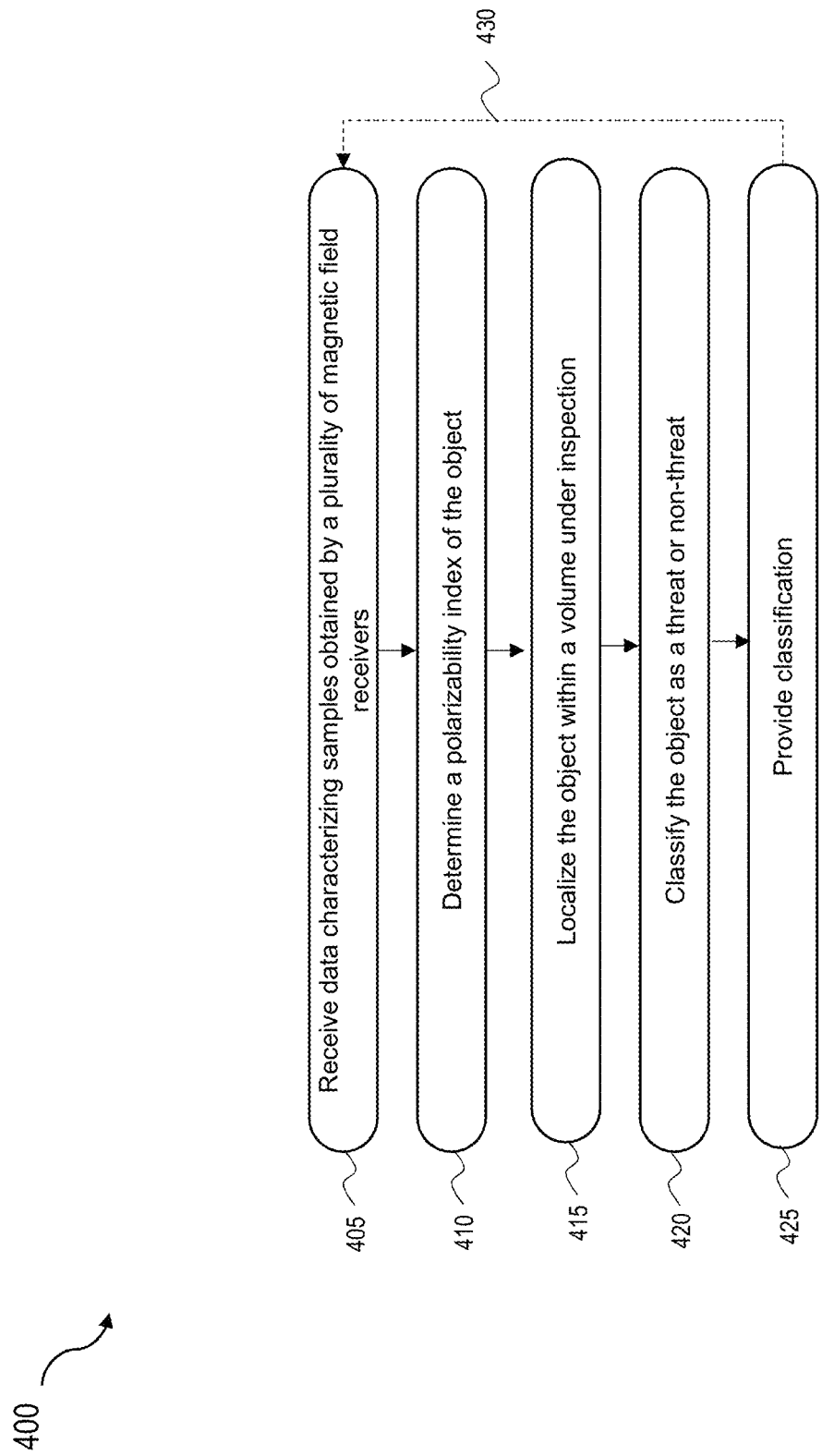
FIG. 4 is a process block diagram illustrating an example process for an example inspection system according to some aspects of the current subject matter.

FIG. 4 is a process block diagram illustrating an example process 400 for an example inspection system according to some aspects of the current subject matter.

At 405, the processing system 120 can receive data characterizing samples obtained by a plurality of magnetic field receivers 105. For example, the magnetic field samples can be acquired by receivers 105 and images (e.g., video) can be acquired by a camera or other sensor 125. An event (e.g., identifying that a person is approaching and/or entered the observational domain) can be identified. For example, an event can be identified based on event data signal received from a photocell testing occupancy of the system or motion in a field of view of the camera feeds. The received event data can cause the system to initiate object detection, or alternatively the system can be configured to search for an object in the absence of event data.

At 410, the data acquisition module 130 aggregates an amount of magnetic field data for processing by subsequent components. For example, the data acquisition module 130 can transmit a copy of a circular buffer containing magnetic field time samples from a plurality of receivers in the system. The calibration module 135 can be configured to account for deviations in the magnetic field data, as compared to a pre-prepared model including amplitude, phase, or environmental characteristics. The reconstruction module 140 can be configured to determine a best-fit object or objects which can be defined by a set of attributes including position, speed, time-offset, and polarizability index. Best fit can be determined by a cost function that measures the difference between the actual measurements and those predicted by a model (e.g., residual), and can also include other attributes that may suggest the plausibility of a solution such as the isotropy of the polarizability index. The polarizability index can include a complex tensor including 1-6 unique elements characterizing directional polarizability components of the object at one or more frequencies transmitted by the transmitters 106. These attributes, including the polarizability index, can be determined simultaneously or in series using an optimization routine, such as a gradient descent algorithm or a nested parameter search. The model can be, for example, an isotropic or an anisotropic model, with uniform or non-uniform motion through the scan zone. In some embodiments, features derived from the polarizability index of the object can characterize a shape, a permeability, and a conductivity of the object within a unit of volume.

At 420, the automatic threat recognition module 145 can classify the object as a threat or non-threat. A threat/non-threat decision can be based on physical attributes, such as matching the polarizability index or a subset of its components against known polarizability index examples from previously determined threat objects, such as a gun barrel or a knife. Alternatively, a threat/non-threat decision can use a classifier trained by in a machine learning process, in which many labeled examples of threats and non-threats are used to train the magnetic sensing algorithm to determine if a newly detected object should be characterized as a threat or non-threat. The classification can include making threat/non-threat determinations using the frequency and the shape information.

Finding multiple objects in the same domain (e.g., either spatially or temporally) can be indicative of a detection event associated with the visitor passing through the inspection system disclosed herein. The magnetic sensing algorithm can combine these objects for classification by an aggregate classifier that is capable of making additional use of the combined information, as compared to classifiers that run on each object independently. For example, the classifier can add some properties of the neighboring objects together, as if they constitute an underlying large and/or distributed object that is best considered as a whole.

At 425, the classification can be provided. The classification can be provided, for example, via a display such as display 165. In some implementations, the classification can be provided to a backend security management system that can coordinate multiple assets (e.g., screening or inspection devices). In some implementations, the classification can be stored in memory 155 of the processing system 120. In some implementations, the classification can be stored in a database configured within the inspection system to store the polarizability index associated with determined threats and determined non-threats.

At 430, the system 100 can repeat the steps of process 400 in an iterative manner.

Figure 5:
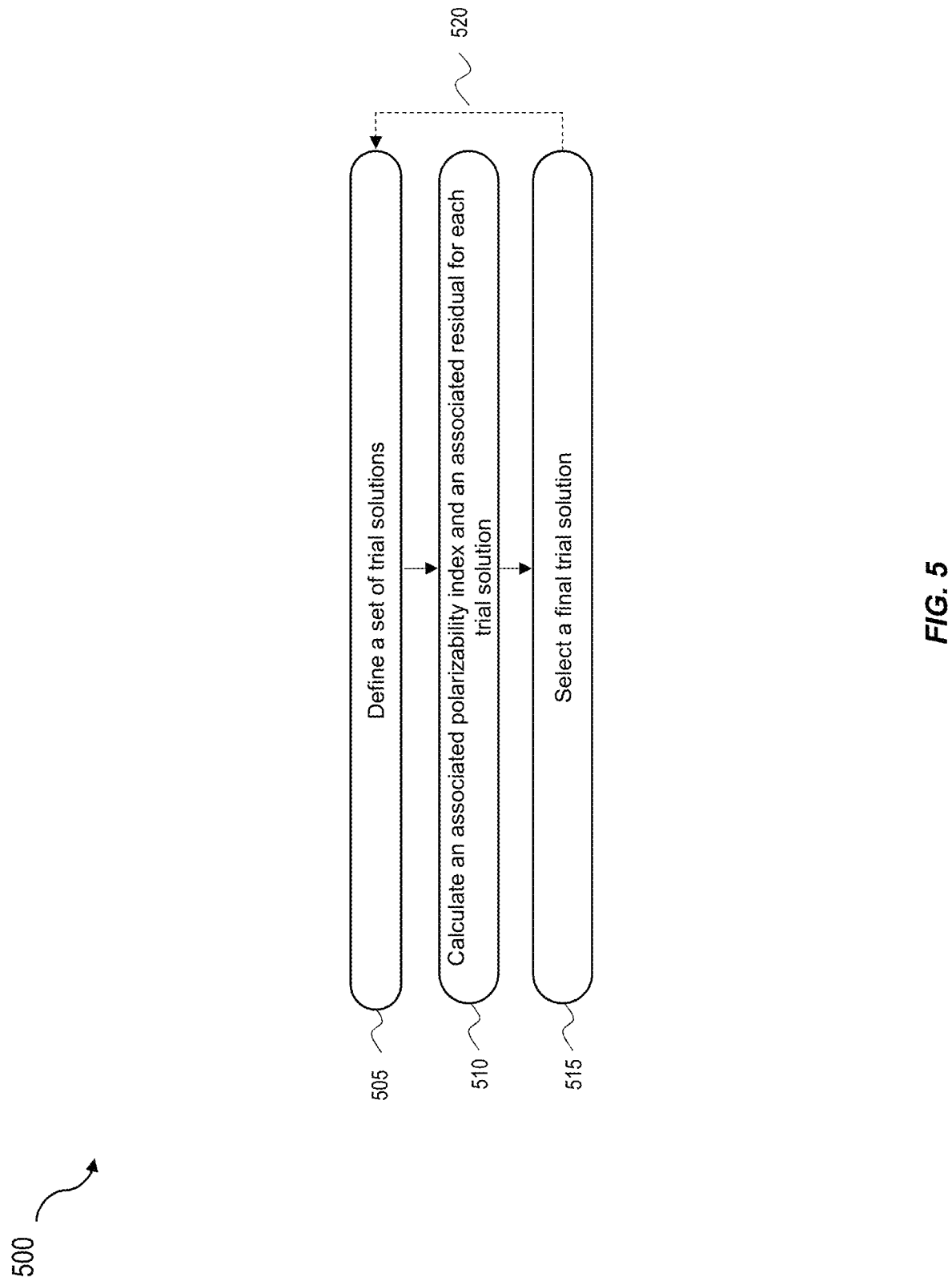
FIG. 5 is a process block diagram illustrating an example process for determining a polarizability index of an object in an example inspection system according to some aspects of the current subject matter.

FIG. 5 is a process block diagram illustrating an example process 500 for determining a polarizability index of an object in an example system 100 according to some aspects of the current subject matter. In some implementations, a set of magnetic field samples can be provided as an input to the process 500. The set of magnetic field samples can be collected simultaneously while probing an object with a set of transmitted fields. The process 500 can include introducing a set of trial solutions that can be solved independently via pseudo-inverse, from which the trial solution with the smallest residual can be selected. The process 500 can be performed to determine isotropic and anisotropic polarizability indexes. The process 500 can be extended to include samples collected over time while an object experiences motion relative to the system 100.

At step 505, the automatic threat recognition module 145 can define a set of trial solutions. A series of trial solutions can be indexed to include magnetic field samples associated with the possible locations in which the object may be present. For each location, the automatic threat recognition module 145 can determine a corresponding polarizability index based on computing a transfer matrix and a pseudo-inverse for each of the magnetic field samples to determine the set of trial solutions. In some implementations, the transfer matrixes and the pseudo-inverses can be predetermined and stored in memory 155.

At step 510, the automatic threat recognition module 145 can calculate an associated polarizability index and an associated residual for each trial solution. For example, isotropic polarizability indexes can be determined based on selecting the trial solution which best fits the magnetic field samples. When determining an anisotropic polarizability index, the polarizability index can be considered as a complex symmetric tensor defined by 6 unique polarizability elements. The pseudo-inverse can be applied and the polarizability index associated with each of the 6 unique polarizability elements can be computed.

At step 515, the automatic threat recognition module 145 can select a final trial solution. The final trial solution can be selected as the trial solution with the minimum or lowest residual. During operation, the automatic threat recognition module 145 can capture the magnetic field samples in real-time. The set of pseudo-inverses can be applied via matrix multiplication. Subsequently, the transfer matrixes can be applied to compute the residuals. The trial solution with the lowest or minimum residual can then be selected.

At 520, the automatic threat recognition module 145 can repeat the steps of process 500 in an iterative manner.

Figure 6:
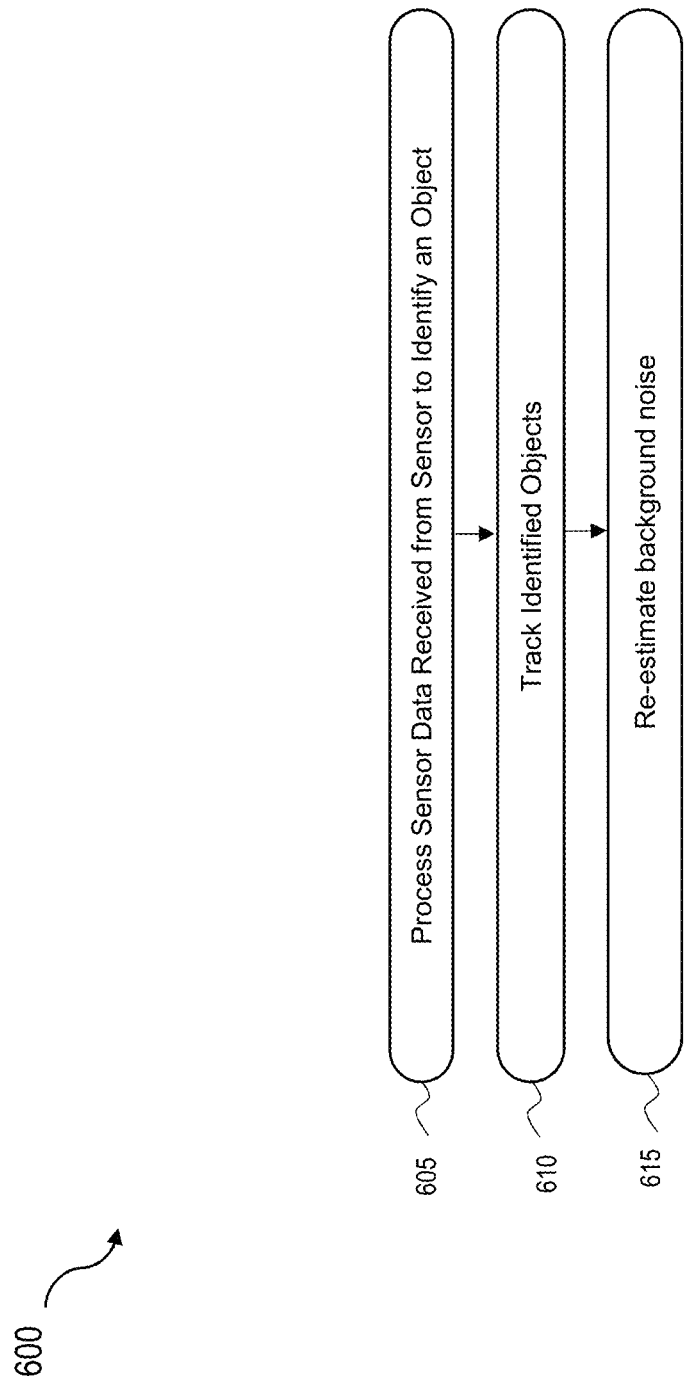
FIG. 6 is a process block diagram illustrating an example process for detecting objects on individuals within large groups of persons in an example inspection system according to some aspects of the current subject matter.

FIG. 6 is a process block diagram illustrating an example process 600 for detecting objects on individuals within large groups of persons using an example inspection system according to some aspects of the current subject matter. The inspection system described herein can also enable accurate detection of metal objects on persons walking together in groups and can be configured to detect metal objects on large numbers of persons at a time as compared to traditional systems which are limited to scanning one person passing through the inspection system at a time. Because large groups of people assembled in an unorganized manner can make it difficult for an inspection system to determine when to start and/or stop a scan, the magnetic sensing algorithm used in the system described herein can dynamically adapt to conditions where many objects may be sensed simultaneously and the objects travel through the system in an overlapping fashion in time which can result in conditions where there is not a clear scan start or stop.

At step 605, the processing system 120 can process sensor data received from sensor 125 in a streaming manner via the magnetic sensing algorithm, such that the magnetic sensing algorithm can find one or more objects whenever the object(s) happened to pass through the system and recognizes when insufficient data has been collected in regard to an object(s). The processing system 120 can determine that a sufficient amount of data has been collected based on the goodness of fit of the model to the real data, or by the proximity of the found object to the end of the data buffer (e.g., present time). If the processing system 120 determines that insufficient data is found, nothing is done, and the magnetic sensing algorithm simply executes again at the next available moment or after an allotted amount of additional data has been collected.

At step 610, the processing system 120 can then store and account for found objects to avoid detecting the same object over and over again. For example, the modeled signals associated with the found object(s) can be recomputed and can be subtracted from the measured data before searching for the next object. The magnetic sensing algorithm can also be biased to search for objects which are located away from the previously found objects, for example, by modifying the cost function in the reconstruction module 140 to penalize objects found in close vicinity with already stored objects.

The processing system 120 and the magnetic sensing algorithm can be configured to execute at regular intervals, such that an amount of elapsed time from when sufficient data has been collected on an object and when the magnetic sensing algorithm is executed to find that object can be minimized. The magnetic sensing algorithm can detect the object to be found within a time period that extends slightly into the future, e.g., beyond the time point at which the object data was collected and processed so far (if this best fits the available data), and uses this scenario as criteria for knowing when to wait for more data.

At steps 615, the magnetic sensing algorithm of the processing system 120 can re-estimate background noise in subsequent executions by opportunistically processing a retained buffer to determine "quiet times" which can be defined as time-periods where the processed signals vary little relative to neighboring time-periods. The "quiet time" data can be used as a proxy for a condition in which no object is present near the sensors. A different optimal set of "quiet time" samples can be found for every sensor, accounting for the conditions when an object(s) may be near some sensors but not near other sensors at different points in time. When an object is found, it can be stored in a buffer or a memory 155 of processing system 120. This buffer data can be processed in the next iterative execution of the magnetic sensing algorithm, which subtracts all previously found objects from the available data so as to avoid contamination/distortion in the present object search.

Figure 7:
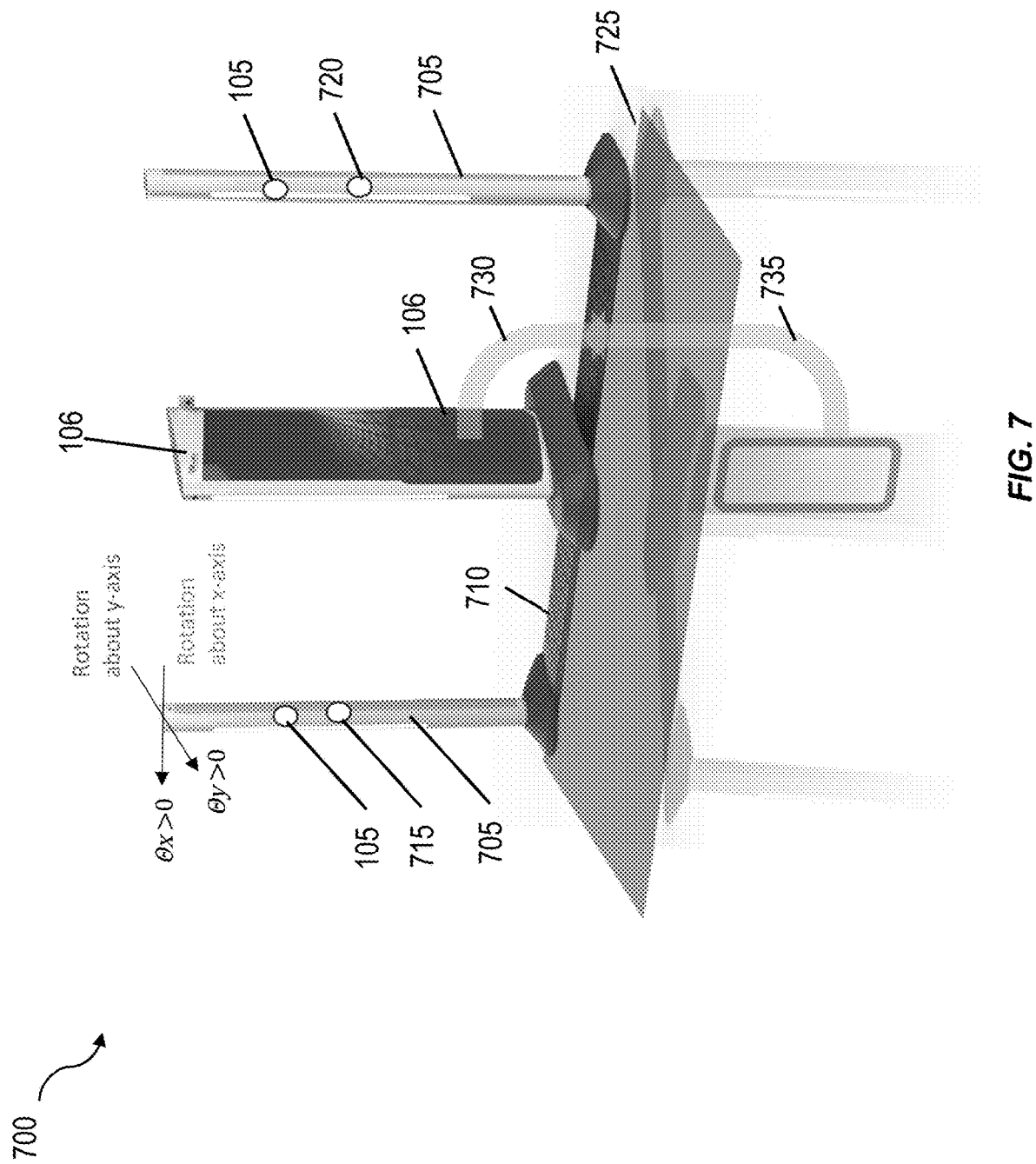
FIG. 7 is a diagram illustrating an exemplary implementation of a personnel inspection system.

FIG. 7 is a diagram illustrating an exemplary implementation of a personnel inspection system 700 according to the subject matter disclosed herein. The system 700 includes similar components performing similar functionality as the components described in relation to the discussion of FIGS. 1-3.

Traditional personnel inspection systems commonly include an archway through which an individual must pass for threat evaluation and detection. In these traditional inspection systems the archway or some other overhead member can carry wiring conveying power and data signals between one or more components of the inspection system, ensure alignment of sensors configured on or within components of the inspection system, and to add stability to the overall structure of the inspection system with respect to environmental conditions such as wind, or uneven mounting surfaces. However, traditional inspection systems that include archways or other overhead elements are often aesthetically unappealing and can create a sense of distrust, anxiety, and claustrophobia for individuals passing through the archway.

The improved inspection system described in relation to FIG. 7 provides the advantages of conveying power and data signals to various inspection system components, ensuring alignment of the inspection system components and reducing emotional response for individuals without requiring them to pass through an archway or overhead element of an inspection system.

A further consideration that the improved personnel inspection system disclosed herein addresses is the non-uniformity of the operating environments in which the system may be located. Operating environments can include hard, yet somewhat smooth surfaces, such as a tile floor, an asphalt surface, or a concrete floor, as well as softer surfaces which can be non-uniform, such as a sand covered surface at a beach entrance or the surface of a grassy field at an entrance to an outdoor music festival.

The system 700 disclosed herein can be deployed in a variety of different locations, indoor and outdoor, and can be configurable based on different kinds of surfaces on which the system may be positioned. For example, the base plate 710 can be configured as a universal base plate to which a variety of modular mounting systems can be attached depending on the venue at which the system is located and/or the surface upon which the system 700 is located. The modular mounting systems can enable positioning, leveling, and coupling or adherence to the surface of the location at which the system is deployed for operation. For example, the base plate 710 can be configured with suction cups on the bottom side (the side facing the surface of the location at which the system is deployed) to secure the base plate 710 to hard surfaces, such as tile or marble. In some implementations, the base plate 710 can include gripping or piercing mechanisms capable of securing the base plate 710 to soft surfaces, such as carpet. In some implementations, the base plate 710 can include screw or auger-like mechanisms to couple the base plate 710 to dirt or terrestrial surfaces. In some implantations, the base plate 710 can be configured with a base plate frame that is hidden within the base plate 710 and provide for permanent installation of the system.

Conventional security systems require visitors to pass through a portal for detection where an archway is used to carry data signals and power to/from each part of the system, to ensure proper alignment of the various sensors, and to add stability to the overall structure. Improper alignment can generate unwanted biases in the system's performance, and motion of the archway structure, for example in environments which may include high wind. Improper alignments can cause unwanted distortions to be generated which are difficult to separate from the desired signals. Archways, however, are visually unaesthetic and can create a sense of distrust and unpleasantness for visitors passing through them.

As shown in FIG. 7, the system 700 disclosed herein can be configured to provide proper location of the posts 705 which can comprise the receivers 105 described in relation to FIGS. 1 and 3, and to provide proper orientation/leveling of the posts 705. In some implementations, a base plate 710 can be configured to receive the posts 705 and ensure proper alignment of the posts at appropriate and predetermined locations. In some implementations, the system 700 shown in FIG. 7 can include inclinometers configured to instruct an operator in a leveling procedure. In some implementations, the inclinometers can be used by the magnetic sensing algorithm to compensate for a known misalignment. In some implementations, the system 700 can include accelerometers to compensate for structural instability in the system and to track motion in of system components. The accelerometer data can be provided to the magnetic sensing algorithm. In some implementations, signals generated by the inclinometers and/or accelerometers as well as power to the inclinometers and/or accelerometers the can be routed through the base plate 710. In some implementations, the signals generated by the inclinometers and/or accelerometers can be transmitted wirelessly to the system 100. In some implementations, the base plate 710 can include a plurality of slots to receive the posts 705 or other structures suitable for mounting one or more sensors 125.

The base plate 710 can be a semi-rigid low profile mat configured to accurately position the location and orientation of the bases of the Rx and Tx posts 705. An inclinometer 415 can determine relative tilt angles between the Rx and Tx posts 705 at installation. When the system 700 determines the relative tilt angles are above some threshold value, the operator can be alerted and asked to improve or remedy the leveling of the posts 705.

For example, in some implementations, the tilt angles can be used to revise the location and orientation of the sensors.

The location and orientation of the sensors can be further used to create the sensor model relied utilized by the reconstruction module 140

In some implementations, accelerometers 720 can be configured to track the tilt angles dynamically, which enables the system to track motion of various sensors in the system. For example, when combined with known field gradients which can be determined with respect to motion for the various sensors, the calibration module 135 can predict distortions to be expected for measured motions. This prediction can then be removed from the measured signal to recover a more accurate representation of the signal measured as if there was no motion. In this example, the fields to be modeled and removed can be the measured motion, such as the displacement or the tilt of the sensors multiplied by the field gradients for each direction/type of motion.

Magnetic-field-based personnel inspection systems can detect or receive magnetic fields which have been transmitted by the system, such as by transceivers 106, and an objects secondary fields which can impacted by the presence of metal in the environment in which the inspection system is deployed. Environmental magnetic fields, such as those which may be reflected by metal which is nearby the inspection system, such as in a metal floor on which the inspection system located, can negatively impact the inspection systems performance to accurately discriminate and detect threat objects. Determining and characterizing the amount of metal in every environment in which the inspection system is located can be difficult, expensive, and often impossible.

As further shown in FIG. 7, the system 700 can be configured to account for physical, metallic structures which may be present in locations where the system is deployed, such as a metal floor. Receivers 105 can detect the transmitted fields 730 generated by the transmitters 106, as well as secondary fields of an object being detected 735. The secondary fields can be impacted by the presence of metal in the environment which may be present in proximity of system, such as in the floor 725 underneath the system. The presence of metal in the floor can negatively impact the system's detection performance and accuracy. Locating and characterizing metal in each environment can be difficult and expensive. To account for the presence of metal in the environment, the system 700 can fit an appropriately parameterized model of metal present in the environment based on determining how the magnetic fields 735 transmitted from the metal floor 725 are distorted relative to a known model. The system 700 can include an image model, whereby the metal in the floor 725 is accounted for as a complex-weighted mirror image of the entire system including the transmitters 106 and the receivers 105. For example, the image model can model a perfect electric-conductor, which is known to modify magnetic fields in a very predictable and analytically describable way. The image model can then be parameterized by a depth with respect to the sensor coordinate system, and an overall complex weight of magnitude less than or equal to 1. Measurements of transmitted field 730 can be used to perform an optimization routine by fitting the complex weight of the mirror image and the depth of plane of the mirror image. Such an optimization routine can search (for example, by trying various pre-defined solutions or via gradient descent) for the model parameters that best fit the measured data. For example, the optimization routine can perform the search by trying previously defined solutions or using a gradient descent optimization. These model parameters can subsequently be used in the operation of the system during threat/non-threat detection. As a result, the system 700 can automatically detect objects more accurately in deployed environments which may or may not include metal in proximity to the system.

Figure 8:
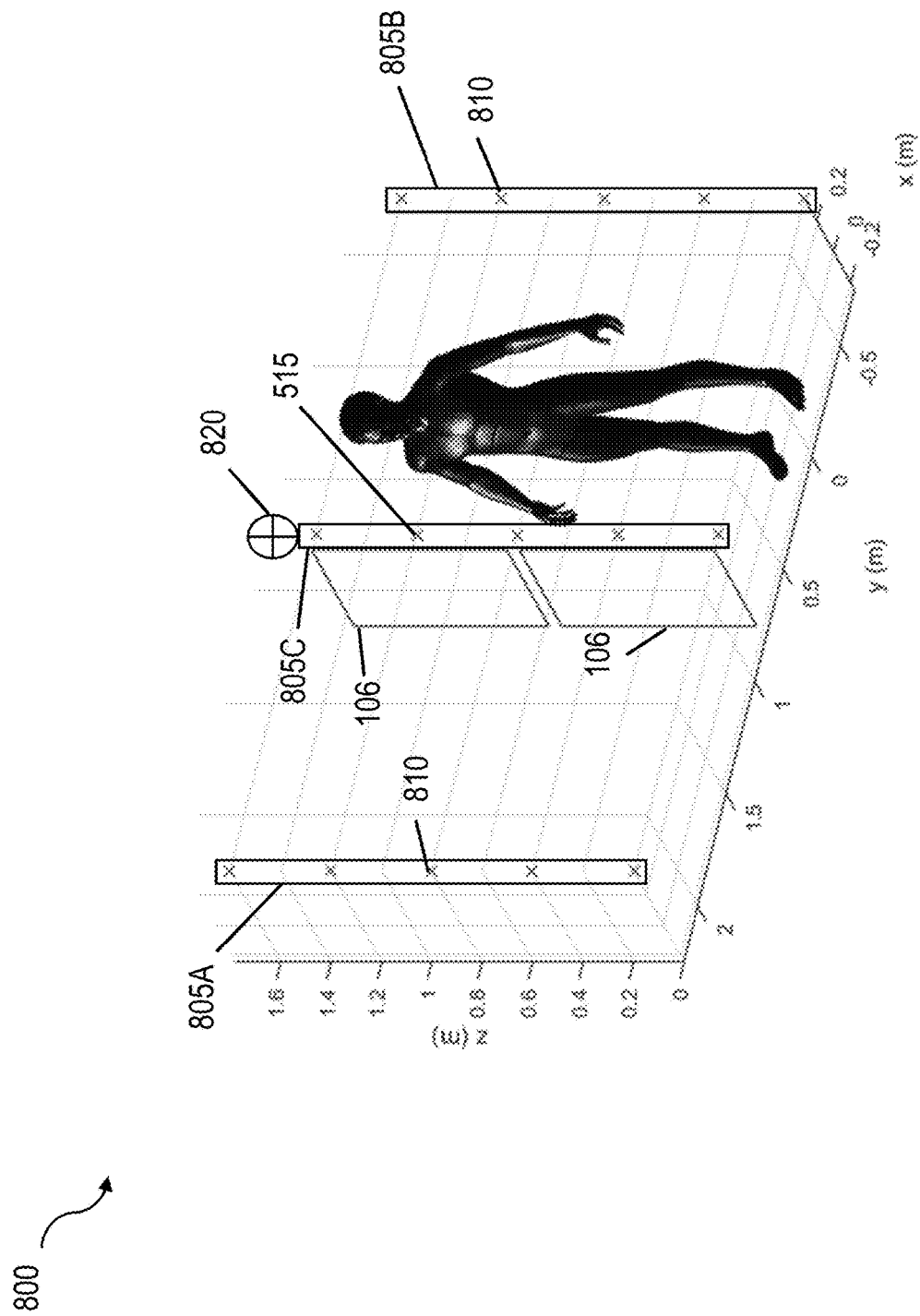
FIG. 8 is a diagram illustrating an exemplary configuration of a personnel inspection system including a plurality of sensors and transmitters at different locations.

FIG. 8 is a diagram illustrating an exemplary configuration of a personnel inspection system 800 as disclosed herein including a sensor and transmitters 106 at different locations according to some implementations. In the illustrated example, the system 800 includes two transmitters 106, two vertical posts, 805A and 805B, each including a plurality of three-axis fluxgate receivers 810. Each of the three-axis fluxgate receivers are illustrated as an "x" and configured on or within posts 805A and 805B. The system 800 further includes a vertically oriented post 805C located adjacent to the two transmitters 106. The post 805C includes a plurality of two-axis fluxgate receivers 815. The number of each type of component, such as the transmitters 106 and/or the fluxgate receivers 105, can be determined by balancing the cost and complexity of additional components with the marginal gain that that additional component add to the fidelity of the magnetic sensing algorithm.

The system 800 can further include a camera 820 integrated with the system 800. In some implementations the camera 820 can be configured on or within one or more of the posts 805A, 805B, and 805C, as well as configured on or within the transmitters 106. The camera 820 can generate images and video, in a streamed or recorded manner. The integrated camera 820 can be configured with an appropriate viewing angle. For example, in some implementations, the camera 820 can be a rear-facing camera.

When an alarm is generated in response to the personnel inspection system detecting a threat, the alarm must be resolved by an inspection system operator or other security team member. Resolving the alarm requires the operator or security team member to interact with the individual and to follow security protocols to search the individual. Security protocols may not always be followed properly by the operator or security team member. A manager of the security team or inspection system operator may be unable to ascertain whether or not appropriate security and searching protocols are being followed. The improved personnel inspection system described in relation to FIG. 8 addresses these issues.

For example, the camera 820 can provide images or video with a sufficient field of view so that supervisors of inspection system operators could evaluate an inspection system operator's response to an alarm or detected object. In this way, the camera 820 integrated within the system 800 can enable a supervisor or manager of inspection system operators to assess an operators adherence to screening procedures or policies, provide training feedback, provide images or video for evidentiary purposes, record alarm resolution actions taken by an operator. In some implementations, the image or video from the camera 820 can be combined with an image of a detected object generated by the system and used to refute or support allegations of improper treatment by inspection system operators.

A personnel inspection system employing magnetic sensing is limited to sensing metal on an individual passing through the inspection system and is unable to detect the body or physical characteristics of an individual passing through the inspection system. In this way, the personnel inspection system lacks the concept of a person passing through the inspection system and can thus generate limited information about the individual to an inspection system operator.

The improved inspection system described herein and shown in FIG. 8 can include a camera 820 to detect persons passing through the inspection system 800. In some implementations, the camera 820 can be a depth camera. A depth camera can include a camera configured to use stereo vision to calculate depth in images acquired by the depth camera. Depth cameras can include depth sensors, and infrared projectors. In some implementations, the depth camera can include a color sensor configured to detect light in the red, green, blue (RGB) scale, also known as RGB sensors. The outputs of the depth cameras can be used to determine a location, orientation, or disposition of a detected object, as well as the speed or gait of the object passing through the inspection system. The outputs of the depth cameras can allow the inspection system to count a number of objects or individuals passing through the inspection system and to track one or more individuals passing through the inspection system. The inspection system disclosed herein, when configured to include a depth camera, can provide a number of advantages compared to inspection systems which may not include a depth camera. Such advantages can include more rapid identification of threat objects or individuals and more robust notification or alarm data provided to identify a threat object or individual.

In such implementations, the depth camera 820 can register its coordinate system with the automatic threat recognition sub-system 145 configured within the inspection system 100 as shown in FIG. 1.

In this way, the system can have simultaneous knowledge of a visitor's location/disposition and any metal objects on them in a common coordinate system. Such implementations enable a magnetic sensing algorithm to be directed towards those voxels which are occupied by the visitor and/or specific areas on the visitor (such as pockets, bags, and ankles). For example, the voxels of the OD 107 can be compared to the pixels obtained via the depth camera to determine which voxels are occupied (e.g., there is a pixel with coordinates sufficiently close to this voxel), unoccupied (e.g., there is no pixel with coordinates sufficiently close to this voxel and no chance of occlusion), or unknown (e.g., a pixel has been found that may obscure the OD 107 whether or not an object resides in this voxel). Then, the magnetic sensing algorithm can be restricted to only search for objects in the occupied and/or unknown voxels.

In addition, using knowledge the speed and gait of the visitor in the magnetic sensing algorithm can improve its accuracy, as well as count and track visitors into and out of the system for statistical reporting. Accuracy of an optimization routine is usually improved when the number of variables it must solve for can be reduced or constrained. Knowledge of the speed and location of a visitor would allow constraining or imposition of these attributes on the object that the optimization routine is solving for.

In such implementations, the depth camera 820 (or any sensor 125 or combination of sensors capable of providing both RGB and depth values at various pixels, such as a structured light camera or stereo cameras) can be integrated directly into the system 100 of FIG. 1. In this way, the image data obtained by the depth camera can be available to the magnetic sensing algorithm. Given knowledge of the location, orientation, and lens properties of the depth camera, the pixels obtained via the depth camera can be registered to the coordinate system of the automatic threat recognition sub-system 145 of FIG. 1, such that each pixel, given a returned depth value, can be translated into the 3D coordinate system of the magnetic sub-system by a series of transformations.

As such, the depth camera(s) 820 can identify which voxels in the magnetic sub-system's scan zone are occupied and/or unoccupied at a given moment in time, and the magnetic sensing algorithm can be directed accordingly. The speed and gait of the subject can also be estimated and used in the magnetic sensing algorithm to more accurately identify any concealed objects. An object which may be discovered via the magnetic sensing algorithm using particular 3D coordinate(s). The object can then be associated with a subset of pixels in the depth camera image(s) based on a simple distance threshold.

Furthermore, this subset of pixels can be associated with a larger contiguous object identified and segmented from the depth camera 820, either by its depth values or by its RGB values, or both. For example, the system can identify the outline of a person most likely to be carrying the found object. Properties of, either, the neighborhood around the object or the person identified to be holding the object can be used in its classification. For example, the person's face can be compared to a watch list via a facial recognition algorithm, and past history or knowledge of this person can be used in classifying the object. At the same time, a threat overlay image made by applying a threat overlay atop of the RGB image can be enhanced to aid operator recognition by highlighting either the visible container of the object or the person holding the object, or both. This can help improve an operator's reaction time and accuracy in resolving an alarm triggered by the system.

Figure 9:
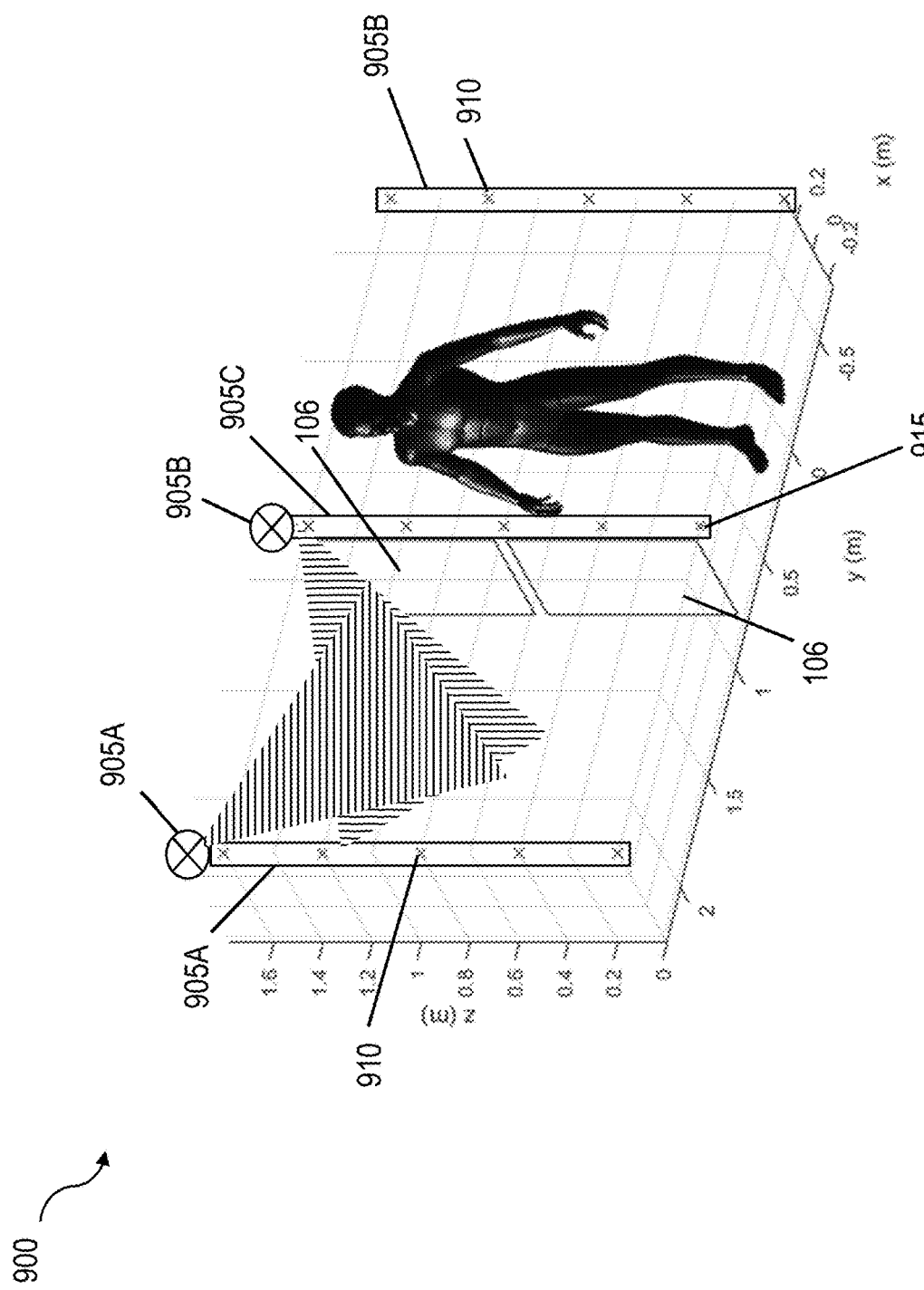
FIG. 9 is a diagram illustrating an exemplary configuration of a personnel inspection system including a plurality of cameras.

FIG. 9 is a diagram illustrating an exemplary configuration of a personnel inspection system 900 as disclosed herein including a plurality of cameras according to some implementations. By configuring the inspection system 900 with a plurality of cameras, the inspection system can better determine which particular individual and where on the particular individual to search. Personnel inspection system which lack threat localization using multiple cameras to generate multiple viewing angles allow large, unorganized crowds of individuals to be screened without forming queues for individual screening and can identify potential threats localized in three dimensions. Additionally, when an alarm associated with a detected threat is generated, the use of multiple cameras generating multiple view angles enables the system to visually identify an individual associated with the detected threat using the captured images to facilitate informing an inspection system operator or other security personnel where to search the identified individual for the detected threat. Alternate solutions, which may use lights or a solely still image to identify an individual associated with a detected threat, may only provide an occluded viewing angle from a single camera. The single view angle may be insufficient to safely and efficiently identify a detected threat on an individual among a crowd of individuals passing through the inspection system.

As shown in FIG. 9, the system 900 includes posts 905A and 905B. The posts 905A and 905B include a plurality of three-axis fluxgate receivers 910. Post 905C includes a plurality of two-axis fluxgate receivers 915. Post 905C also includes transmitters 106.

In some implementations, multiple individuals can pass between the posts 905A, 905B, and 905C at any one time. For example, two people may pass through posts 905A and 905B at the same time which can result in obscuring the field of view of a single sensor, such as sensor 125 described in relation to FIG. 1. As a result, in implementations including a single sensor, the field of view of the sensor can become occluded. In some implementations, multiple sensors can be included in the inspection system to avoid an occluding field of view at a single sensor and to provide multiple viewpoints.

As shown in FIG. 9, multiple cameras, such as cameras 905A and 905B, can be configured within the personnel inspection system 900. The cameras 905A and 905B can be registered to the system's coordinate system representing the coordinates of the OD 107 to perform threat localization from multiple viewpoints. As objects are tracked through time, each camera can determine the location of the threat across or within multiple time-slices. Thus, even if a viewing angle from a single camera 905A is occluded at one moment in time, the likelihood that the viewing angle of a second camera 905B is also occluded at all available moments in time is very low. The system can provide the inspection system operator images and/or videos from all viewing angles and can utilize the images and/or videos from one or more cameras to determine the actual threat location. In some implementations, the rendering module 150 can be further configured to automatically select optimal viewing angles and/or time-slices for presentation to aid the operator's recognition and response to a detected threat. For example, the image that has the greatest number of pixels occupied in the vicinity of the found object is likely to give a reasonable and un-occluded view of the object.

For example, as shown in FIG. 9, the system 900 includes two fisheye cameras, 905A and 905B. Each camera is mounted on opposing posts 905A and 905C in order to capture a scan zone from two very distinct viewing angles. Each pixel in the images and/or videos generated by both cameras is mapped to the coordinate system of system 900 at multiple planes along the direction of an object or person passing through a lane formed between posts 905A and 905C. The system 900 can be configured to generate an alarm localized in a particular plane of view associated with camera 905A or 905B. Visual representations or threat indicators can be overlaid on images and/or video generated by each camera and centered on the appropriately registered pixels corresponding to the detected threat. The system 900 can be configured to repeat these operations for multiple planes of view as the object or person passes through the system so as to produce a threat overlay image or video from each camera.

The videos and/or images from one or all cameras can be shown to the operator via a computing device communicatively coupled to the system 900, such as a laptop, tablet or other mobile computing device configured with a display. In some implementations, the system can utilize a threshold criterion for determining if a viewing angle of one of the cameras is occluded. The system 900 can determine occlusion, for example, by determining a depth estimate of the pixels in question by evaluating motion in the video stream, or by incorporation of a depth camera. If the system 900 determines that the depth estimate is not consistent with the 3D coordinate returned by the system, then the viewing angle should be considered occluded, and the system can determine that the image will not be useful in guiding the response of an operator.

In some implementations, the inspection system 900 can process the additional sensor data, such as a video or images, and can relay an image, a video, or a video frame of a subject alongside or overlaid with classification results. For example, the inspection system 900 can overlay a graphical indicator atop an image and the graphical indicator can identify the detected threat or object. In some implementations, the image overlaid with the graphical indicator can be provided with additional metadata about the individual, detected object, or system parameters. In some implementations, the image overlaid with the graphical indicator can be provided to an individual, such as an inspection system operator or security guard who can be located further downstream in the sequence of objects or individuals being inspected via the inspection system. In this way, the inspection system can provide the image overlaid with the graphical indicator to the inspection system operator or security guard for additional monitoring and/or interception of the detected object, threat, or individual.

Although a few variations have been described in detail above, other modifications or additions are possible. For example, the number of receivers is not limited and some implementations may include any number of receivers. The transmitters are not limited to a particular frequency, for example, coils with different properties (operating frequencies, locations, and the like) can be used. Different reconstruction algorithms may be used and different features may be used for threat detection.

Without in any way limiting the scope, interpretation, or application of the claims appearing below, a technical effect of one or more of the example implementations disclosed herein may include one or more of the following, for example, some example implementations of the current subject matter can perform threat detection and discrimination in high clutter environments in which individuals may be carrying personal items such as cell phones and laptops and without personal item divestment. In some implementations, a personnel inspection system can perform threat detection and discrimination with high throughput that allows individuals to pass through the metal detector at normal walking speeds such that individuals are not required to slow down for inspection and, in some implementations, the inspection threshold can allow for multiple individuals to pass through the threshold side-by-side (e.g., two or more abreast). In some configurations, individuals walking in near proximity can be screened, thereby eliminating the need for screened individuals to remain stationary during the screening process.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A method comprising:
    receiving, by at least one data processor, from a plurality of magnetic field receivers comprising magnetic sensors, data characterizing samples obtained by the plurality of magnetic field receivers, the samples based on a combination of a first magnetic field and a second magnetic field resulting from interaction of the first magnetic field and an object;
    determining, by the at least one data processor, a distortion component of the samples obtained by the plurality of magnetic field receivers;
    determining, by the at least one data processor, motion compensated samples by at least removing, from the samples obtained by the plurality of magnetic field receivers, the distortion component;
    classifying, by the at least one data processor, using the motion compensated samples, the object as a threat or a non-threat; and
    providing the classification.

2. The method of claim 1, wherein the first magnetic field is generated by a magnetic field generator arranged on a first support and the received data characterizing the samples is arranged on a second support, the first support and the second support coupled to one another via a base plate comprising an inclinometer.

3. The method of claim 2, wherein the distortion component is determined based on signals generated by the inclinometer.

4. The method of claim 3, wherein the signals generated by the inclinometer are processed by at the least one data processor to compensate for a misalignment.

5. The method of claim 3, wherein the signals generated by the inclinometer comprise tilt angles between the base plate and the first support and the second support.

6. The method of claim 2, wherein the inclinometer provides an instruction for a leveling procedure.

7. The method of claim 2, wherein determining of the distortion component of the samples obtained by the plurality of magnetic field receivers is based on displacement angles of the first support and predetermined field gradients.

8. The method of claim 7, wherein determining of the distortion component of the samples obtained by the plurality of magnetic field receivers comprises multiplying the displacement angles of the first support by the predetermined field gradients.

9. The method of claim 7, wherein the displacement angles of the first support characterize a motion of the first support.

10. The method of claim 1, wherein the at least one data processor is further configured to determine a second distortion component of the second magnetic field based on an amount of metal present at a location where the plurality of magnetic field receivers are deployed.

11. A system comprising:
    a first support comprising a magnetic field transmitter configured to generate a first magnetic field;

a second support comprising a plurality of magnetic field receivers including magnetic sensors, the plurality of magnetic field receivers configured to generate samples based on a combination of the first magnetic field and a second magnetic field resulting from interaction of the first magnetic field and an object;

a base plate comprising an inclinometer and being coupled to the first support and the second support; and at least one data processor configured to at least:

receive data characterizing the samples obtained by the plurality of magnetic field receivers;

determine a distortion component of the samples obtained by the plurality of magnetic field receivers based on signals generated by the inclinometer;

determine motion compensated samples by at least removing, from the samples obtained by the plurality of magnetic field receivers, the distortion component;

classify, using the motion compensated samples, the object as a threat or a non-threat; and providing the classification.

12. The system of claim 11, wherein a proximal end of the first support and a proximal end of the second support are coupled to the base plate, and a distal end of the first support and a distal end of the second support are not connected to an archway coupling the distal end of the first support to the distal end of the second support.

13. The system of claim 11, wherein the distortion component is determined based on signals generated by the inclinometer.

14. The system of claim 13, wherein the signals generated by the inclinometer are processed by at the least one data processor to compensate for a misalignment.

15. The system of claim 13, wherein the signals generated by the inclinometer comprise tilt angles between the base plate and the first support and the second support.

16. The system of claim 11, wherein the inclinometer provides an instruction for a leveling procedure.

17. The system of claim 11, wherein determining of the distortion component of the samples obtained by the plurality of magnetic field receivers is based on displacement angles of the first support and predetermined field gradients.

18. The system of claim 17, wherein the displacement angles of the first support characterize a motion of the first support.

19. The system of claim 11, wherein the at least one data processor is further configured to determine a second distortion component of the second magnetic field based on an amount of metal present at a location where the system is deployed.

20. The system of claim 19, wherein determining the motion compensated samples comprises removing, from the samples obtained by the plurality of magnetic field receivers, the second distortion component.

* * * * *